United States Patent
Jennings

[11] Patent Number: 6,140,205
[45] Date of Patent: Oct. 31, 2000

[54] METHOD OF FORMING RETROGRADE WELL IN BONDED WAFFERS

[75] Inventor: Dean Jennings, San Ramon, Calif.

[73] Assignee: Elantec, Inc., Milpitas, Calif.

[21] Appl. No.: 08/844,973

[22] Filed: Apr. 23, 1997

[51] Int. Cl.⁷ .................................................. H01L 21/30
[52] U.S. Cl. ...................... 438/406; 438/459; 438/479; 438/517; 438/977; 438/154; 438/311
[58] Field of Search ....................... 438/406, 455, 438/459, 458, 479, 977, FOR 485, 154, 311, 517

[56] References Cited

U.S. PATENT DOCUMENTS

| | | |
|---|---|---|
| 4,638,552 | 1/1987 | Shimbo et al. |
| 4,968,628 | 11/1990 | Delgado et al. |
| 5,004,705 | 4/1991 | Blackstone ........................ 438/455 |
| 5,466,303 | 11/1995 | Yamaguchi et al. ................. 438/455 |
| 5,514,235 | 5/1996 | Mitani et al. ....................... 438/455 |
| 5,538,904 | 7/1996 | Mitani et al. ....................... 438/455 |

*Primary Examiner*—Mary Wilczewski
*Attorney, Agent, or Firm*—Fliesler, Dubb, Meyer & Lovejoy LLP

[57] ABSTRACT

A method of forming a semiconductor substrate, comprising the steps of: providing a device substrate of a first conductivity type having a first surface and a second surface, and a handle substrate; depositing a dopant in the first surface of the wafer; diffusing the dopant through the wafer from the first surface toward the second surface, thereby forming a well; bonding the first surface of the device wafer to the handle substrate; and thinning the device substrate to yield a final device layer with a retrograde well. The dopant may be of the first or a second conductivity type.

21 Claims, 5 Drawing Sheets

METHOD OF FORMING RETROGRADE WELL IN BONDED WAFFERS

BACKGROUND OF THE INVENTION

1. Field of the Invention

The invention relates to the formation of conductive regions in silicon substrates.

2. Description of the Related Art

Integrated circuits manufactured on a silicon substrate comprise a series of interconnected active devices formed in and on the substrate. Each active device is formed by introducing impurities into a surface of the substrate, generally through the use of implantation or diffusion of the impurity, to vary the conductivity of specific regions of the substrate. The bulk substrate will generally be comprised of a material having first conductivity type, with the impurities selected to form regions in the substrate of opposite conductivity type or enhanced conductivity.

In forming some types of integrated circuits, particularly bipolar devices, it is desirable to provide layers of dopant which are "buried" below the surface of the device layer. Traditionally, a buried layer was formed in a substrate prior to the deposition of a layer of epitaxial silicon which was provided on the surface of a single crystal substrate and into which the active devices were formed. The buried region was formed by implantation or diffusion of the selected impurity in the substrate layer. In bipolar devices, buried layers are provided to reduce bulk resistance in collector regions. However, when the substrate is heated during processing, any buried materials which are formed in an epitaxial layer will diffuse back toward the surface of the epitaxial layer, thus reducing the effective depth that devices may be formed in the layer. In bipolar technologies, each diffusion step requires additional heating of the substrate, and hence dopants already present in the substrate or epitaxial layers will diffuse further. P type dopants are relatively quick diffusing materials and hence this back diffusion problem is particularly acute when the buried region is formed with p type dopants.

Advances in wafer processing technology have increased the popularity of so-called "bonded" wafers. In bonded wafer technology, two single-crystal substrates—a device substrate and handle substrate—are joined so that dopants can be introduced into a first surface of the device substrate to form an impurity region which subsequently becomes a buried region when the device substrate is bonded to the handle substrate at the first surface. In general, the handle wafer is comprised of a semiconductor having a first conductivity type, such as a p-type substrate, while the device substrate is comprised of a second conductivity type, such as an n-type substrate.

The handle wafer is "bonded" to the first substrate through any number of techniques. In some cases, Van der Waals forces may suffice to bond the surfaces (where tolerances are exacting, as disclosed in U.S. Pat. No. 4,638,552), or a thin oxide layer may be used between the surfaces (such as in U.S. Pat. No. 4,968,628), after which the substrates are heated to ensure bonding of the substrates to each other. This latter process is generally illustrated in FIGS. 1–4.

FIGS. 1–4 are cross sections generally showing the procedure for manufacturing an active device having a buried layer using a bonded wafer technique and junction isolation. Each of the active devices in an integrated circuit must be electrically isolated from the adjoining active region to prevent cross-over electrical effects between adjoining devices which would defeat overall operation of the circuit. The devices are thereafter connected to a series of metal or metal-alloy interconnect structures to complete the integrated circuit device.

FIG. 1 shows a p-type silicon substrate 10. Substrate 10 will have formed therein, for example, a p+ type region 12 by implantation or diffusion. Region 12 will become a buried layer formed in substrate 10 by selective diffusion. The surface of substrate 10 must be polished to a high tolerance surface finish, such as by chemical mechanical polishing, and may have a thin oxide layer formed thereon such as shown in FIG. 2. Oxide layer 14 is formed on the surface of substrate 10.

As shown in FIG. 3, a handle wafer 15 is thereafter bonded to substrate 10. Handle wafer 15 is generally an n-type substrate and will also have a thin layer of oxide formed on the surface to be bonded, such surface also being polished to a high degree of smoothness. The oxide on the handle wafer will contact oxide layer 14 on the surface of substrate 10. The wafers may then be heated to a temperature of about 1,000° C. and held there for a period of time of about one hour. This causes the oxide layers to bond, thereby joining wafers 10 and 15. The resulting combined oxide layers 14' define the desired dielectric isolation thickness. Further processing can then occur on the backside 16 of substrate 10. Note that p+ region 12 becomes a buried region within the completed assembly.

As shown in FIG. 4, an n well 19 will be formed in substrate 10, and p+ emitter and collector contacts 17,18, and n+ base contact 20 may be formed to complete a PNP bipolar transistor.

While additional n+ regions 11 may be provided to serve as reverse biased PN junction lateral device isolation, the degree of isolation afforded by junction isolation is limited by collector-substrate leakage currents and collector-substrate capacitance. Several alternative isolation techniques have developed to prevent leakage currents from impeding device performance, including dielectric isolation and trench isolation.

The use of well regions or tubs—separate regions of impurities in which a device will be formed—is commonly used in numerous technologies, such as bipolar, complementary bipolar, and CMOS. This allows for device isolation and the provision of both PNP and NPN transistors on the same substrate.

While a single type of well may be formed in a substrate—i.e., all n-wells in a p type substrate—in some applications, it is necessary to provide wells of both conductivity types in the substrate. Wells are generally formed by implantation or diffusion of a doping impurity into the substrate. A particular type of well region which has been found useful is a so-called "retrograde" well. In a surface diffused well, the impurity concentration per unit volume decreases as one goes deeper into the substrate, away from the substrate surface. In a retrograde well, the concentration of the impurity relative to the substrate surface increases to a certain depth, then decreases. For example, normal diffusion involves deposition of the impurity into the surface, followed by a heating step wherein the dopant diffuses into the substrate and the concentration of the dopant varies with depth, with the concentration per unit area decreasing as diffusion continues.

The most common method for forming retrograde wells in CMOS technology is to use successive impurity implants at varying energies into the substrate. This process is illustrated in FIGS. 5–7.

FIG. 5 shows a semiconductor substrate 20 of a first conductivity type, such as a p-type substrate, in which complementary wells are to be formed. A photoresist mask layer 22 is deposited over substrate 20 and patterned to expose a window 23 for implantation of well dopant. Arrows 30 illustrate implantation of, for example an n type impurity such as arsenic or phosphorous. A number of successive implants at varying energies in a range of about 200 keV to 5 MeV are performed to achieve the desired profile of the well to be formed. As illustrated in FIG. 6, the high energy implants will form a well 34 with a graded concentration profile, wherein the concentration of the dopant will be greater in region 38 below the surface 21 of substrate 20 in region 36, closer to the surface.

As illustrated in FIG. 7, a masking layer 22 will be stripped and a second masking layer 24 deposited and patterned so that the complementary well region 44 may be formed in a similar fashion. Again, p well 44 has a dopant concentration greater in a region 48 below surface 21 of substrate 20. After implantation, the profile of the retrograde well may be smoothed out using an annealing process. With implantation of varying concentrations of the impurity to various depths, little or no diffusion of the impurity is required and a high degree of control of the well profile is possible. However, implantation of impurities into a substrate generally introduces a great deal of damage to the substrate. Retrograde wells may also be formed by diffusion by first implanting an impurity into the substrate to a depth below the surface of the substrate, then heating the substrate so that diffusion of the impurity takes place and the concentration varies with the highest concentration of material being at some depth below the surface of the substrate, rather than at the surface of the substrate itself. This method is limited by the depth to which one can implant an impurity and by the damage which occurs to a substrate through the initial implant.

Retrograde wells have been found to reduce many of the deleterious effects associated with short-channel, CMOS transistors. In bipolar transistors, the retrograde well characteristic is responsible for minimizing the gain of the inverse bipolar transistor. Further, the reduced well sheet resistance provided by the high peak concentration of the retrograde well reduces latch-up susceptibility.

The disadvantages to the approach of implanting successive layers of an impurity into the substrate include not only the damage which is introduced into a silicon wafer, but also the higher cost of multiple implants, the limited range of ion implant preventing deep retrograde wells from being formed by this method, and the implant-related defect generation from high energy implants.

SUMMARY OF THE INVENTION

The invention, roughly described, comprises a method of forming a semiconductor substrate, comprising the steps of: providing a device substrate of a first conductivity type having a first surface and a second surface, and a handle substrate; depositing a dopant in the first surface of the wafer; diffusing the dopant into the wafer from the first surface toward the second surface, thereby forming a well; and bonding the first surface of the device wafer to the handle substrate. The dopant may be of the first or a second conductivity type.

In a second aspect, the invention comprises a method of forming a silicon-on-insulator substrate, comprising the steps of: providing a device substrate of a first conductivity type having a first surface and a second surface and a handle wafer; depositing a dopant of second conductivity type in the first surface of the wafer; heating the device wafer to diffuse the dopant into the wafer from the first surface toward the second surface thereby forming a well region; implanting a dopant of the second conductivity type in the well region with a larger dose; and bonding the first surface of the device wafer to the handle wafer.

The invention thus provides retrograde well regions with buried layers in a silicon on insulator substrate suitable for use in manufacturing integrated circuits. Less damage to the silicon substrate will result from the method of the present invention over the methods currently in use since fewer and lower energy dopant implantation steps are required.

BRIEF DESCRIPTION OF THE DRAWINGS

The invention will be described with respect to the particular embodiments thereof. Other objects, features, and advantages of the invention will become apparent with reference to the specification and drawings in which.

DESCRIPTION OF THE PREFERRED EMBODIMENTS

An improved process for forming retrograde wells in bonded wafer structures, suitable for use in manufacturing numerous types of integrated structure is hereinafter disclosed. In the following description, numerous details, for example, specific materials, process steps, etc., are set forth in order to provide a thorough understanding of the present invention. It will be obvious, however, to one skilled in the art that the specific details need not be employed to practice the present invention. Moreover, specific details of particular processes or structures may not be specifically presented in order not to unduly obscure the invention where such details would be readily apparent to one of average skill in the art.

FIGS. 8–12 illustrate a first embodiment of the method of the present invention suitable for forming retrograde wells in a bonded wafer substrate. The method is made possible as a result of the freedom to implement wafer processing on the surface of the device wafer which is to be bonded to the handle wafer.

Figure 1:
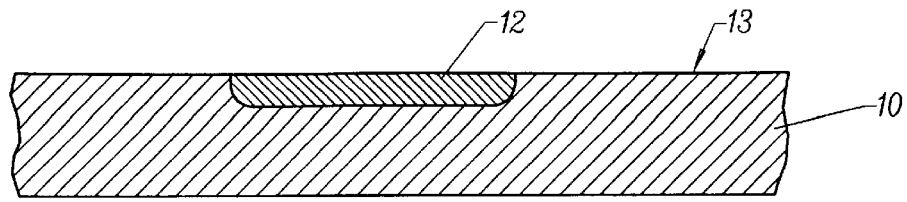
FIGS. 1–4 are cross-sections of a silicon wafer illustrating the process for forming a bonded wafer integrated circuit assembly.
Figure 2:
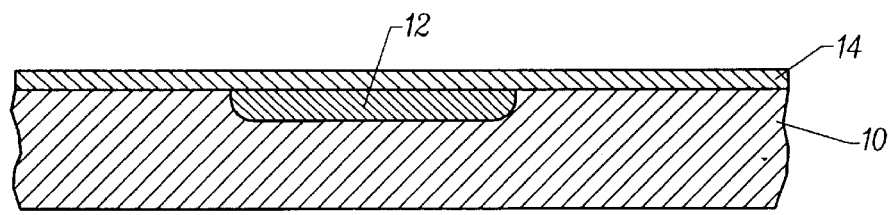
Figure 3:
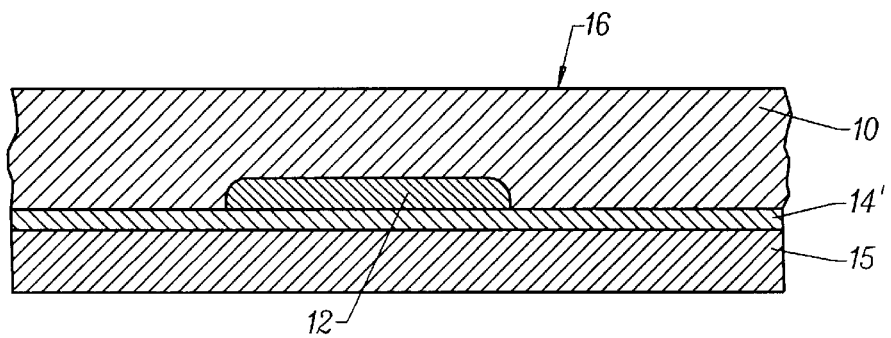
Figure 4:
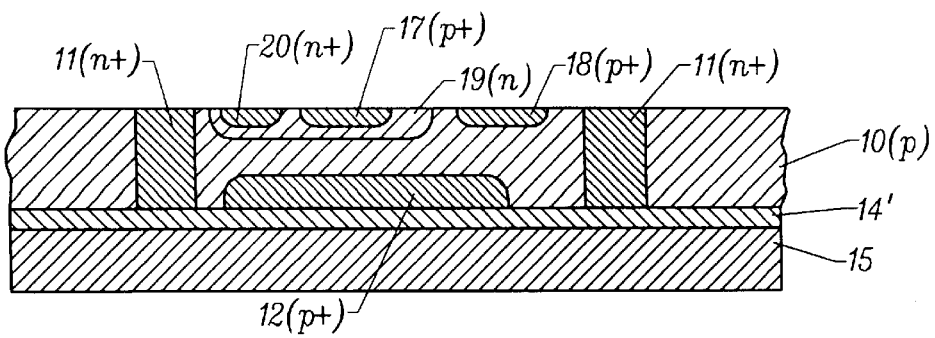
Figure 5:
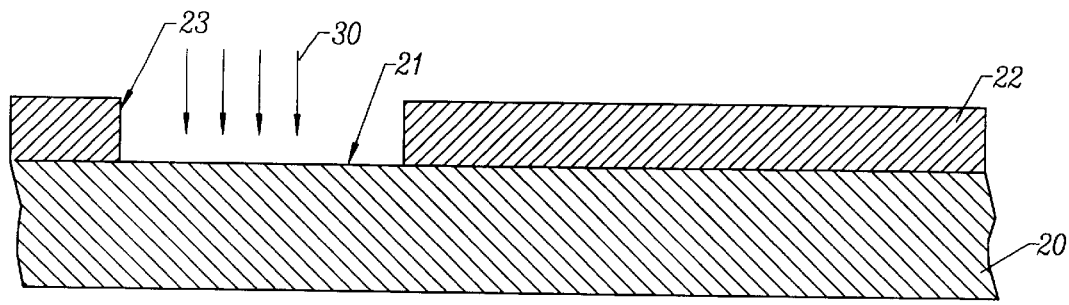
FIGS. 5–7 are cross-sections of a silicon wafer illustrating a prior art method for forming retrograde well regions in a silicon substrate.
Figure 6:
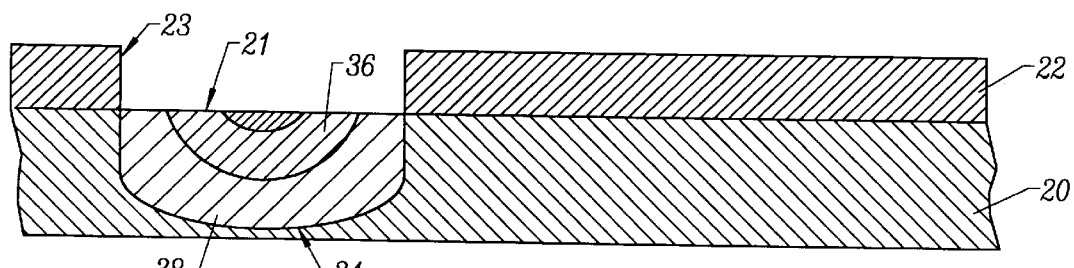
Figure 7:
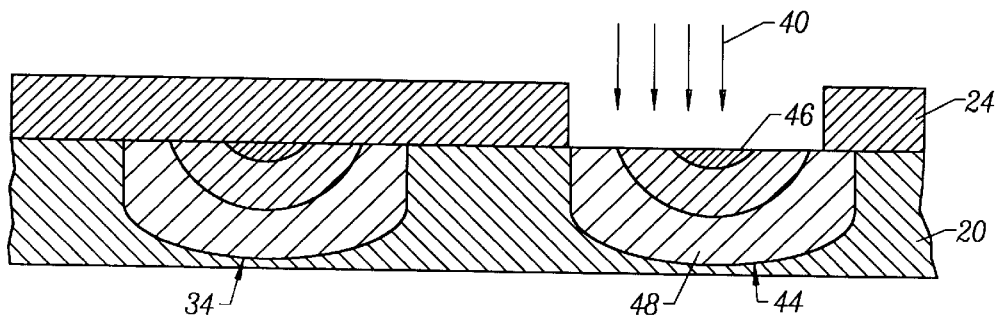
Figure 8:
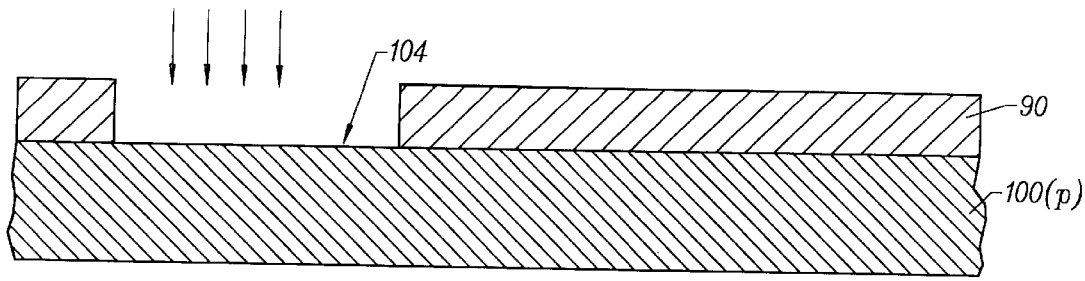
FIGS. 8–11 are cross-sections of a silicon wafer illustrating a first embodiment of the method of the present invention for forming retrograde well regions in a bonded wafer structure.
Figure 9:
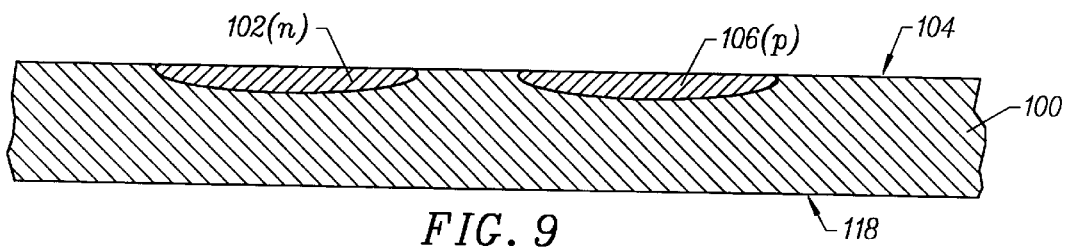

FIG. 8 shows a semiconductor substrate which may be a p type or n type substrate, for purposes of the present invention will be discussed as a p type substrate 100. As shown in FIG. 8, a photoresist mask layer 90 is deposited on the surface 104 of substrate 100. Using conventional photolithography techniques, the mask layer is patterned and selected portions of the mask layer removed to expose a portion of surface 104 of substrate 100 in areas where the well regions are to be formed. Thereafter, an implant of an n type dopant such as phosphorous or arsenic may be made to form a region 102 just below the surface 104 of substrate 100, as shown in FIG. 9. In a further aspect of the invention, if a complementary well structure is desired, a separate masking layer (not shown) and implant (not shown) or CVD process may be utilized to provide a p type region 106 in substrate 100. Regions 102,106 may have a concentration of a dopant impurity in a range of about $1\times10^{17}$ to $1\times10^{19}$ atoms/cm.$^3$. It should be recognized that alternative dopant types in various concentrations may be utilized without departing from the scope of the present invention.

Figure 10:
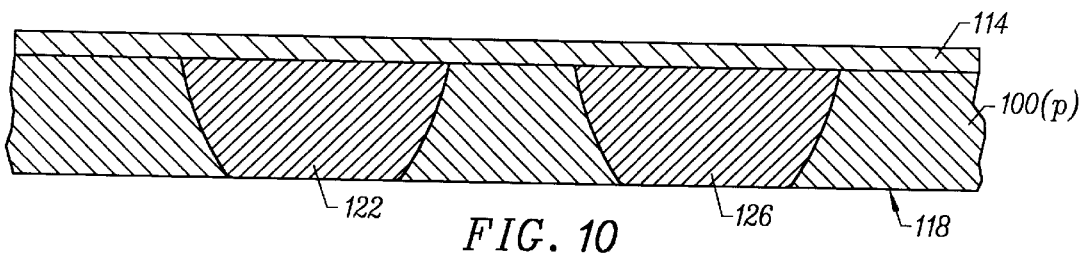
Figure 11:
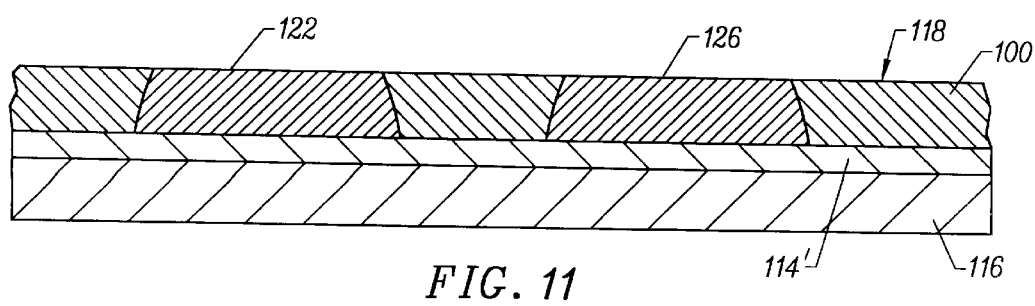

As shown in FIG. 10, substrate 100 may thereafter be heated to diffuse the dopants in regions 102 and 106 to form wells 122,126. Wells 122,126 have a dopant concentration which decreases as a function of depth from surface 104 of substrate 100. In accordance with well-known techniques for forming bonded wafers, the bonding of the device wafer 100 to the handle wafer may be performed by polishing surface 104 of substrate 100 and the bonding surface of handle wafer 116 to a high degree of tolerance and bonding the substrates using Van der Waals forces, generally followed by a heating step, such as by placing wafers in a furnace at a temperature of 1,0000° for a period of about one hour. In many methods of bonding, a thin oxide region 114 will be formed on the surface 104 of substrate 100 and the bonding surface of handle substrate 110, and the substrates bonded using a heating process. The heating process utilized in the bonding substrate 100 to handle wafer 116 will also act to diffuse the dopants in regions 102 and 106, and thus may be utilized as all or a portion of the heating required for diffusion of the dopant regions 102,106 into substrate 100 to form wells 122,126. After bonding, and thinning of the substrate, as shown in FIG. 8, wells 124,126 will have a retrograde profile, where the dopant concentration increases as a function of the depth away from surface 118 of substrate 110. Thinning of the substrate may occur by polishing the substrate or other suitable means.

Oxide layer 114 need not be present either on wafer substrate 100 or handle wafer 116. In accordance with the teachings of U.S. Pat. No. 4,638,552 issued to Shimboler, et al., if the polishing substrate is within a high degree of tolerance, Van der Waals forces will be sufficient to bond the wafers.

Figure 12:
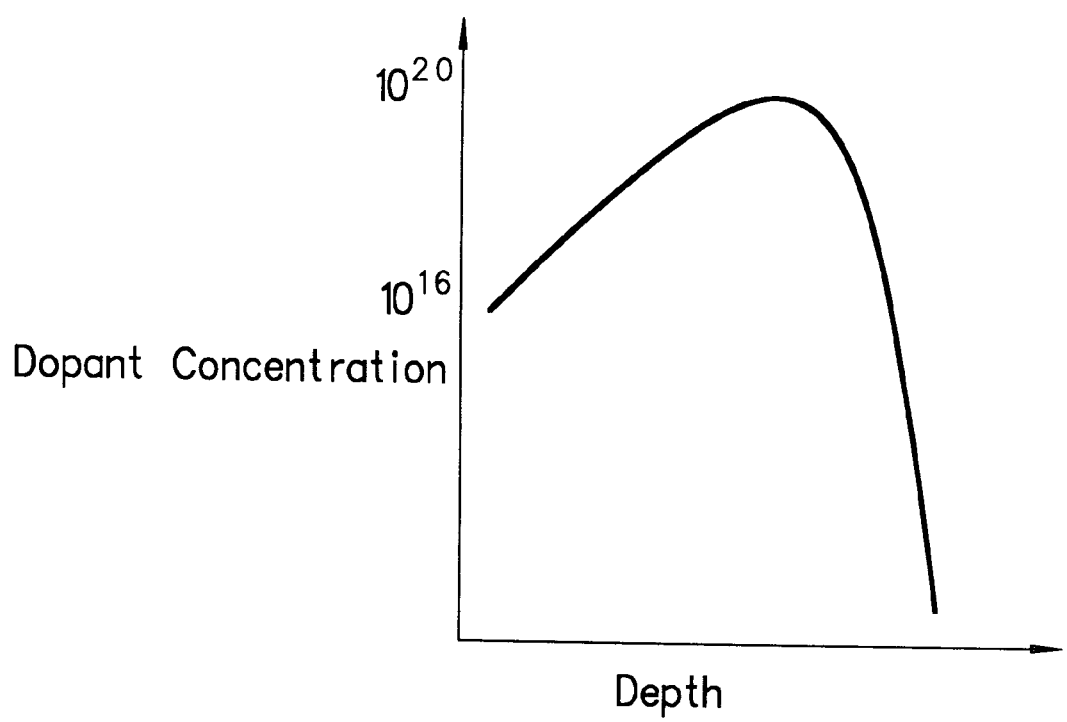
FIG. 12 is a graph of the dopant concentration of the well region versus the depth of the dopant implant in the retrograde well formed in accordance with the present invention.

Wells 122,126 will have a concentration as represented in graph shown in FIG. 12. As illustrated therein, the concentration of the dopant impurity will be greater at a given depth below the surface of the substrate 100. The dopant profile may be varied by factors such as the depth (or thickness) of the device substrate, the conductivity of the device substrate, the dopant used to form regions 102,106, and the time and temperature of the diffusion process. Modification of the profile shown in FIG. 12 to meet any desired profile would be readily within the knowledge of one of average skill in the art.

FIGS. 13–16 show a second embodiment of the method for forming a retrograde wells in bonded wafer substrates, and specifically an embodiment showing the provision of buried regions in the retrograde wells in the substrate.

Figure 13:
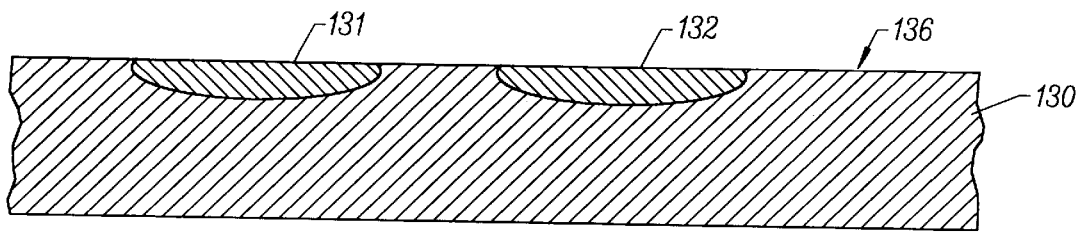
FIGS. 13–16 are cross-sections of a silicon wafer illustrating a second embodiment of a process for forming retrograde wells in a bonded wafer substrate.
Figure 14:
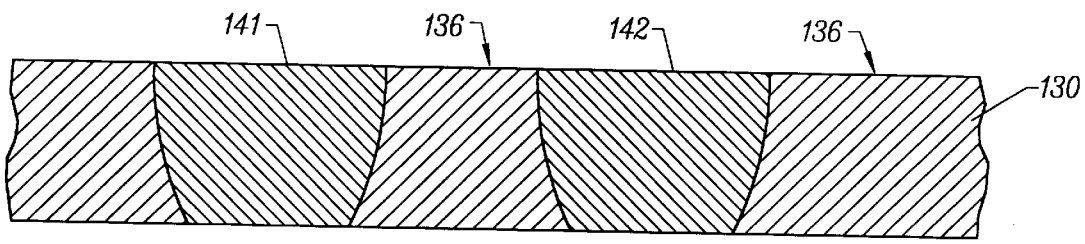
Figure 15:
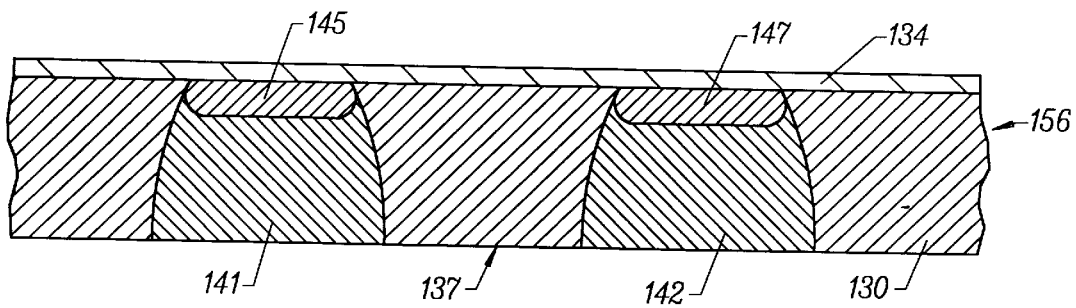

FIG. 13 shows a cross-section of a device substrate 130 which may comprise a p or n type substrate but for purposes of the present description will comprise a p type substrate. N-type dopant regions 131 and 132 may be formed in accordance with well-known techniques for a photoresist mask and dopant implantation (or chemical vapor deposition). As shown in FIG. 14, device wafer 130 is thereafter heated to cause diffusion of the n-type dopant in regions 131, 132 to form respective well regions 141 and 142 having a concentration which decreases from the surface 136 of substrate 130. A low energy implant or other pre-deposition technique and masking step may thereafter be utilized to form dopant regions 145,147, in wells 141 and 142, respectively, illustrated in FIG. 15. Dopant regions 145,147 may be n-type or p-type regions, depending on the conductivity type of the wells and the design of the devices to be formed in the well regions.

Figure 16:
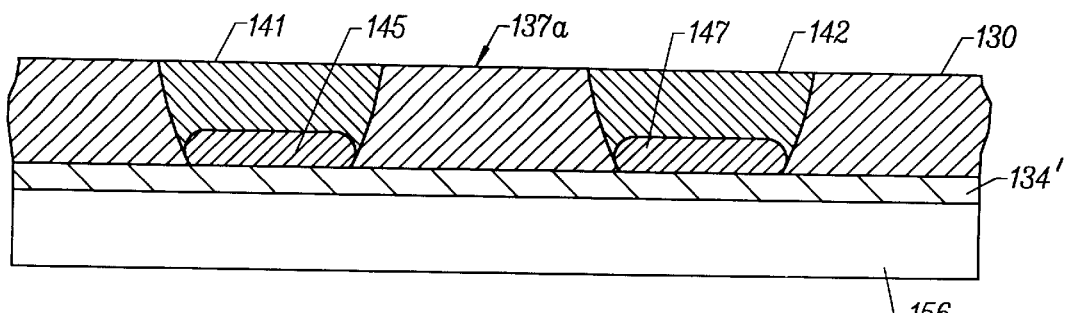

Depending on the nature of the wafer bonding process utilized, oxide layer 134 may thereafter be formed on the surface 136 of device wafer 130. Device wafer 130 is thereafter bonded to handle wafer 156, and the bonding generally completed by heating the wafers at a temperature of 1000 ° C. for a period of one hour. The resulting structure is shown in FIG. 16. During heating, dopant regions 145,147 will diffuse further into substrate 130. Because a slow-diffusing, n type dopant can be utilized in regions 145,147, if a heating step is utilized to bond device wafer 130 to 156, such heating will not result in significant movement of the buried regions 145,147. However, if p type dopants are utilized in region 145,147, because p type dopants have a high diffusivity, the heating process used to bond the wafers and/or the depth of the p type buried layers will be limited.

The features and advantages of the present invention will be obvious to one of average skill in the art. All such features and advantages are intended to be within the scope of the invention as disclosed by the written description of the drawings, and as defined by the following claims.

What is claimed is:

1. A method of forming a semiconductor substrate, comprising:
   (a) providing a device substrate of a first conductivity type having a first surface and a second surface, and a handle substrate;
   (b) depositing a dopant in the first surface of the device substrate;
   (c) forming a well region in which active regions may be formed by diffusing the dopant into the device substrate from the first surface towards the second surface;
   (d) bonding the first surface of the device substrate to the handle substrate;
   (e) thinning the device substrate at the second surface to expose the well region at said second surface;
   (f) forming a first active device in the well region; and
   (g) forming a second active device in the device substrate.

2. The method of claim 1 wherein said step (b) comprises depositing a dopant of a second conductivity type.

3. The method of claim 2 further including the step, between steps (c) and (d) of:
   depositing a dopant of the second conductivity type into the first surface of the device substrate in the well.

4. The method of claim 1 wherein said step (c) comprises:
   diffusing the dopant into the device substrate to form a graded well region having a monotonically decreasing concentration of the dopant from the first surface of the device substrate to the second surface of the device substrate.

5. The method of claim 2 wherein the first conductivity type is an n type impurity.

6. The method of claim 2 wherein the first conductivity type is a p type.

7. The method of claim 2 wherein the dopant is boron, arsenic, phosphorous, antimony.

8. The method of claim 2 wherein the thickness of the device substrate following step (e) is in a range of 2–6 microns.

9. The method of claim 2 wherein said step (c) comprises heating the substrate at a temperature in a range of 1000° C. to 1250° C.

10. The method of claim 2 wherein said step (c) is sufficient to diffuse the impurity such that the impurity reaches the surface of the device substrate.

11. A method of forming a silicon-on-insulator substrate, comprising:
   (a) providing a device substrate of a first conductivity type having a first surface and a second surface and a handle wafer;
   (b) depositing a dopant in the first surface of the device substrate;
   (c) forming a well region in which active regions may be formed by heating the device substrate to diffuse the dopant through the device substrate from the first surface toward the second surface;
   (d) implanting a dopant of the second conductivity type in the well region;
   (e) bonding the first surface of the device substrate to the handle wafer;
   (f) thinning the device substrate to expose the well region at said second surface;
   (g) forming a first active device in the well region; and
   (h) forming a second active device in the device substrate.

12. The method of claim 11 further including the step, following said step (e), of heating the bonded device substrate and handle wafer to diffuse the dopant provided in step.

13. A method of forming a silicon-on-insulator substrate, comprising the steps of:
   (a) providing a device substrate of a first conductivity type having a first surface and a second surface;
   (b) depositing a dopant of a second conductivity type in the first surface of the device substrate;
   (c) bonding the first surface of the device substrate to a handle wafer;
   (d) forming a well region into which active regions may be formed by heating the device substrate to diffuse the dopant through the device substrate from the first surface toward the second surface;
   (e) thinning the device substrate at the second surface to expose the well region at said second surface;
   (f) forming a first active device in the well region; and
   (g) forming a second active device in the device substrate.

14. The method of claim 13 wherein steps (c) and (d) are performed simultaneously.

15. The method of claim 13 further including the steps of (e) implanting a buried region of the second conductivity type in the well region.

16. A method of forming a twin well semiconductor substrate, the substrate comprising a semiconductor substrate having a first surface and a second surface, comprising:
   (a) depositing an impurity of a first conductivity type into the semiconductor substrate through the first surface of the substrate;
   (b) depositing an impurity of a second conductivity type into the semiconductor substrate through the first surface of the substrate;
   (c) diffusing the first and second impurities into the semiconductor substrate to form respective first and second graded well regions into which active regions may be formed, the well regions having monotonically decreasing concentrations of the respective first and second impurities from the first surface of the semiconductor substrate toward the second surface of the substrate;
   (d) bonding the semiconductor substrate to a handle wafer at said first surface;
   (e) thinning the semiconductor substrate at the second surface to expose the well region at said second surface;
   (f) forming a first active device in the impurity of said first conductivity type; and
   (g) forming a second active device in the impurity of said second conductivity type.

17. The method of claim 16 further including the step of implanting buried regions of said first and second impurity types in the first and second graded well region(s), respectively.

18. A method of making complementary transistor devices in a silicon substrate, comprising:
   (a) providing a semiconductor substrate of a first conductivity type having a surface;
   (b) depositing a first dopant of a second conductivity type into the semiconductor substrate through the surface of the substrate;
   (c) diffusing the dopant into the substrate to form a well;
   (d) depositing a second dopant of a second conductivity type into the well;
   (e) bonding the substrate to a handle wafer;
   (f) thinning the substrate;
   (g) forming a first active device in the well; and
   (h) forming a second active device in the substrate.

19. The method of claim 18 wherein the active devices are MOS devices.

20. The method of claim 18 wherein the active devices are bipolar devices.

21. A method of forming a retrograde well in a semiconductor substrate, comprising:
   (a) providing a first substrate of a first conductivity type having a top surface and a bottom surface;
   (b) providing a second substrate of a second conductivity type having a top surface and a bottom surface;
   (c) forming a graded well region having a monotonically decreasing concentration of a first or second conductivity type from the top surface of the first substrate to the bottom surface;
   (d) depositing an impurity of a first or second conductivity type into the first substrate through the top surface of the substrate;
   (e) bonding the top surface of the first substrate to the top surface of the second substrate with an oxide layer between the first and second substrates;
   (f) thinning the first substrate at the bottom surface to expose the well region at said second surface;
   (g) forming a first active device in the graded well region; and
   (h) forming a second active device in the first substrate.

* * * * *